United States Patent
Sato et al.

(10) Patent No.: US 9,702,927 B2
(45) Date of Patent: Jul. 11, 2017

(54) TEST PATTERN GENERATION DEVICE, FAULT DETECTION SYSTEM, TEST PATTERN GENERATION METHOD, PROGRAM AND RECORDING MEDIUM

(71) Applicant: Kyushu Institute of Technology, Fukuoka (JP)

(72) Inventors: Yasuo Sato, Fukuoka (JP); Seiji Kajihara, Fukuoka (JP)

(73) Assignee: Japan Science and Technology Agency, Saitama (JP)

( * ) Notice: Subject to any disclaimer, the term of this patent is extended or adjusted under 35 U.S.C. 154(b) by 441 days.

(21) Appl. No.: 14/371,317

(22) PCT Filed: Jan. 9, 2013

(86) PCT No.: PCT/JP2013/050150
§ 371 (c)(1),
(2) Date: Jul. 9, 2014

(87) PCT Pub. No.: WO2013/105564
PCT Pub. Date: Jul. 18, 2013

(65) Prior Publication Data
US 2015/0006102 A1    Jan. 1, 2015

(30) Foreign Application Priority Data
Jan. 10, 2012 (JP) .................................. 2012-002214

(51) Int. Cl.
*G01R 27/28* (2006.01)
*G01R 31/00* (2006.01)
(Continued)

(52) U.S. Cl.
CPC ... *G01R 31/2834* (2013.01); *G01R 31/31919* (2013.01); *G01R 31/318307* (2013.01)

(58) Field of Classification Search
CPC . G11C 11/5628; G11C 11/5642; G11C 11/56; G11C 2211/5641; G11C 29/52;
(Continued)

(56) References Cited

U.S. PATENT DOCUMENTS

2002/0073373 A1   6/2002 Nakao et al.
2004/0148554 A1*  7/2004 Dervisoglu ...... G01R 31/31833
                                                       714/727

FOREIGN PATENT DOCUMENTS

JP    3-41374       2/1991
JP    2002-181905   6/2002
(Continued)

OTHER PUBLICATIONS

International Search Report dated Apr. 16, 2013 filed in PCT/JP2013/050150.
(Continued)

*Primary Examiner* — Roy Y Yi
(74) *Attorney, Agent, or Firm* — Rankin, Hill & Clark LLP

(57) ABSTRACT

A test pattern generation device for generating a new test pattern keeping the feature of original test patterns. The test pattern generation device includes a logic value generation unit for generating a new logic value by referring given logic values of a first bit, a second bit and a third bit and by keeping or reversing a logic value of the second bit, wherein a logic value of the first bit is the same with a logic value of a given initial test pattern or a new test pattern generated by the test pattern generation device based on the initial test pattern, wherein a logic value of the second bit is the same with a logic value of the initial test pattern, and wherein a logic value of the third bit is the same with a logic value of the initial test pattern or the new test pattern.

9 Claims, 16 Drawing Sheets

(51) Int. Cl.
   *G01R 31/14*    (2006.01)
   *G01R 31/28*    (2006.01)
   *G01R 31/3183*  (2006.01)
   *G01R 31/319*   (2006.01)

(58) Field of Classification Search
   CPC .............. G11C 11/161; G11C 16/0483; G11C 2029/0411; G11C 29/04; G11C 7/1051; G11C 11/413; G11C 15/00; G11C 16/28; G11C 17/14
   See application file for complete search history.

(56) References Cited

FOREIGN PATENT DOCUMENTS

| | | |
|---|---|---|
| JP | 2011-89833 | 5/2011 |
| KR | 2002-0046896 | 6/2002 |
| TW | 546483 | 8/2003 |

OTHER PUBLICATIONS

Lin, Xijiang et al., "Adaptive Low Shift Power Test Pattern Generator for Logic BIST," Asian Test Symposium, pp. 355-360, 2010.

\* cited by examiner

Fig. 1
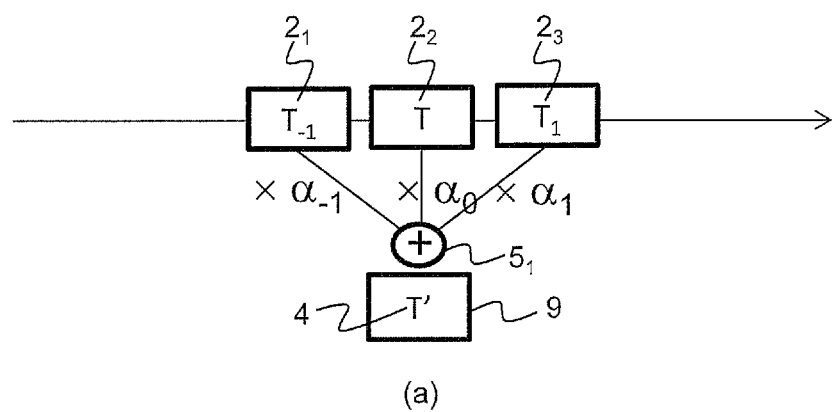
(a)
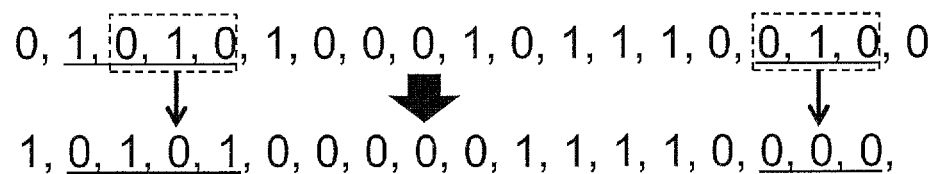
(b)

Fig. 2
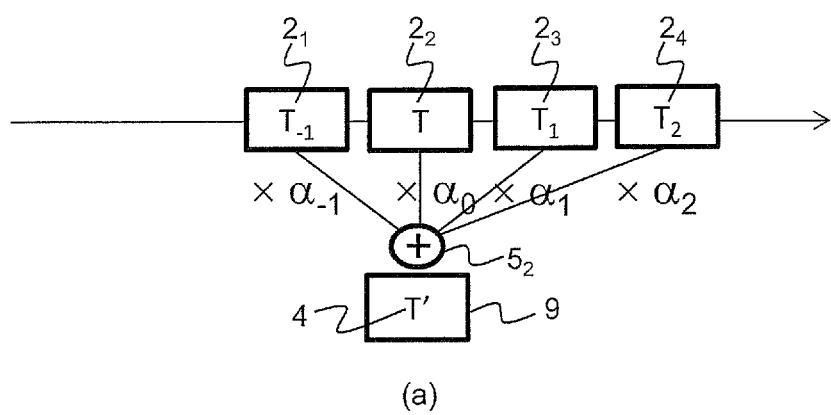
(a)
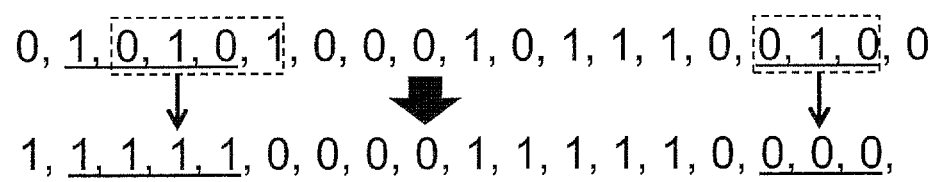
(b)

Fig. 3
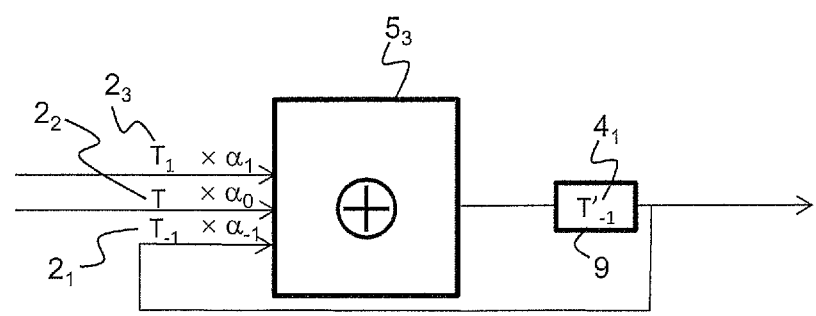
(a)
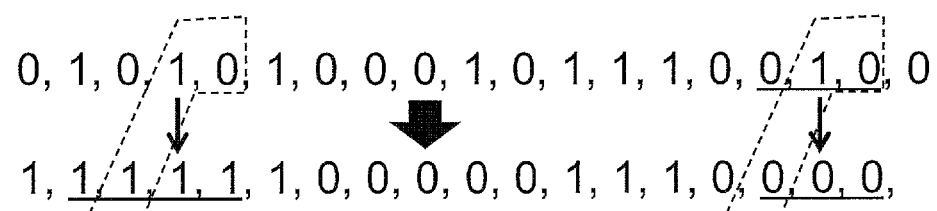
(b)

(a)

■ Example: 5 input bits   coefficient 1/5

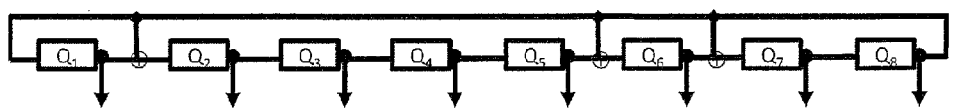

| a | b | c | d | e | f | g | h |
| h | a⊕h | b | c | d | e⊖h | f⊕h | g |
| g | g⊕h | a⊕h | b | c | d⊕g | e⊕g⊕h | f⊖h |
| f⊖h | f⊕g⊕h | g⊕h | a⊕h | b | c⊖f⊕h | d⊕f⊕g⊕h | e⊕g⊕h |
| e⊕g⊕h | e⊕f⊕g | f⊕g⊕h | g⊕h | a⊕h | b⊕e⊕g⊕h | c⊖e⊕f⊕g | d⊖f⊕g⊕h |

| | | | | | | | | |
|---|---|---|---|---|---|---|---|---|
| $T_{-2}$ | $Q_1 \oplus Q_2 \oplus Q_3$ | $Q_4$ | $Q_5$ | $Q_1 \oplus Q_6$ | $Q_2 \oplus Q_7$ | $Q_1 \oplus Q_2 \ominus Q_8$ | $Q_1$ | $Q_1 \oplus Q_2$ |
| $T_{-1}$ | $Q_1 \oplus Q_2$ | $Q_3$ | $Q_4$ | $Q_5$ | $Q_1 \oplus Q_6$ | $Q_1 \oplus Q_7$ | $Q_8$ | $Q_1$ |
| $T$ | $Q_1$ | $Q_2$ | $Q_3$ | $Q_4$ | $Q_5$ | $Q_6$ | $Q_7$ | $Q_8$ |
| $T_1$ | $Q_8$ | $Q_1 \oplus Q_8$ | $Q_2$ | $Q_3$ | $Q_4$ | $Q_5 \oplus Q_8$ | $Q_6 \oplus Q_8$ | $Q_7$ |
| $T_2$ | $Q_7$ | $Q_7 \oplus Q_8$ | $Q_1 \oplus Q_8$ | $Q_2$ | $Q_3$ | $Q_4 \oplus Q_7$ | $Q_5 \oplus Q_7 \oplus Q_8$ | $Q_6 \oplus Q_8$ |

TEST PATTERN GENERATION DEVICE, FAULT DETECTION SYSTEM, TEST PATTERN GENERATION METHOD, PROGRAM AND RECORDING MEDIUM

TECHNICAL FIELD

The present invention relates to a test pattern generation device, a fault detection system, a test pattern generation method, a program and a recording medium, and particularly relates to a test pattern generation device for generating a test pattern to be inputted into a circuit under test or the like.

BACKGROUND ART

As a test method with reduced data volume of test patterns for testing a logic circuit, a Built-In Self-Test (BIST) is known. BIST utilizes a test pattern generation device for generating a new test pattern from an original test pattern. Here, in general, there is trade-off relation between increase of fault coverage of a test pattern and shift power reduction of the test pattern during test. So far, test pattern generation devices or the like have been developed balancing the increase of fault coverage and shift power reduction (See Non Patent Literature 1).

FIG. 16 shows a schematic diagram of a circuit of a test pattern generation device described in Non Patent Literature 1. The test pattern generation device described in Non Patent Literature 1 generates a new logic value from capture output values outputted when the last generated test vector is inputted into a circuit under test. First, the test pattern generation device extracts the last 2 bits from the capture output values outputted when the last generated test vector is inputted into the circuit under test. If the logic values of the extracted 2 bits are different, shift-in is executed without changing the values previously inputted into the scan chain. If the logic values of the extracted 2 bits are the same, a new logic value is inputted. Like this, the test pattern generation device executes shift-in with/without reversing the value outputted from LFSR, referring the comparison result between the last 2 bits of the capture output values outputted when the last generated test vector is inputted into a circuit under test.

CITATION LIST

Non Patent Literature

[Non Patent Literature 1]: X. Lin, et al., "Adaptive Low Shift Power Test Pattern Generator for Logic BIST," Proc. Asian Test Symposium, pp. 355-360, 2010.

SUMMARY OF INVENTION

Technical Problem

However, the test pattern generation device described in Non Patent Literature 1 generates a new test pattern referring to only the sequence of capture output values outputted when logic values of the last generated test pattern are inputted into the circuit under test. Besides, the test pattern generation device refers them only for judging if the output value from LFSR should be reversed or not. Thus, in essence, a totally-new test pattern is generated independently of the referred original test pattern.

Here, the given original test pattern is generally a test pattern which already has specific features for some purpose such as high fault coverage or reduction of capture power, not shift power. The test pattern generated by the test pattern generation device described in Non Patent Literature 1 may lose such features of the original test patterns because keeping the original features is not taken into consideration.

It is, therefore, an object of the present invention to provide a test pattern generation device or the like for generating a new test pattern keeping the feature of original test patterns.

Solution to Problem

A first aspect in accordance with the present invention provides a test pattern generation device for generating a test pattern to be inputted into a circuit under test of scan test, comprising a logic value generation unit for generating a new logic value by referring given logic values of a first bit, a second bit and a third bit and by keeping or reversing a logic value of the second bit, wherein a logic value of the first bit is the same with a logic value of an initial test pattern which is a given test pattern or with a logic value of a new test pattern generated by the test pattern generation device based on the initial test pattern, wherein a logic value of the second bit is the same with a logic value of the initial test pattern, and wherein a logic value of the third bit is the same with a logic value of the initial test pattern or with a logic value of the new test pattern.

A second aspect in accordance with the present invention provides the test pattern generation device of the first aspect, further comprising a storing unit for storing a logic value generated by the logic value generation unit, wherein a logic value of the first bit is, in advance, generated by the logic value generation unit and stored in the storing unit, and wherein the logic value generation unit generates a logic value of a bit included in a newly generated test pattern by keeping or reversing a logic value of the second bit, based on logic values of the first bit stored in the storing unit, the second bit and the third bit.

A third aspect in accordance with the present invention provides the test pattern generation device of the second aspect, wherein the first bit, the second bit and the third bit are bits to be input into pluralities of spatially adjacent scan chains or bits to be input into the circuit under test temporally continuously via a single scan chain, and wherein the storing unit is a scan flip-flop.

A fourth aspect in accordance with the present invention provides the test pattern generation device of any of the first through the third aspect, wherein the logic value generation unit includes pluralities of different combinational circuits that output logic values; and a switch unit that switches the pluralities of different combinational circuits, wherein, into one of the pluralities of different combinational circuits, logic values of 0 or 1 of the first bit, the second bit and the third bit are input.

A fifth aspect in accordance with the present invention provides the test pattern generation device of the fourth aspect, further comprising an extraction unit that extracts a part of or all of logic values including those of the first bit, the second bit and the third bit from logic values of the initial test pattern and/or a test pattern generated by the test pattern generation device; a condition judgment unit that judges if number of reverse of logic values extracted by the extraction unit along spatial adjacency and/or temporal continuity reaches a predetermined number or not; and a feedback unit that feeds a judgment result by the condition judgment unit back to the switch unit.

A sixth aspect in accordance with the present invention provides a fault detection system that detects a fault based on output from a circuit under test, comprising an initial input test pattern storing unit that stores a test pattern generated by the test pattern generation device of any of the first through the fifth aspect as an initial input test pattern; a first extraction unit that extracts a part of or all of pluralities of output logic values outputted from the circuit under test into which the initial input test pattern is inputted in advance; a comparison unit that compares an output logic value extracted by the first extraction unit, and an output logic value estimated to be outputted if there is no fault in the circuit under test or an output logic value estimated to be outputted if there is a specific fault in the circuit under test; and a fault judgment unit that judges if there is a fault or not in the circuit under test based on comparison result by the comparison unit, wherein the pluralities of output logic values are inputted into the circuit under test as a new input test pattern, wherein each of the pluralities of logic values are stored in a storing unit which stores logic values into pluralities of individual storing units which stores a single logic value, wherein the first extraction unit extracts a part of or all of the pluralities of output logic values stored in the storing unit, and wherein the first extraction unit extracts a part of or all of the output logic values stored in the pluralities of individual storing units directly without passing through another individual storing unit.

A seventh aspect in accordance with the present invention provides the fault detection system of the sixth aspect, further comprising a first extraction control unit that controls the first extraction unit; and a dummy cycle assignment unit that assigns number of dummy cycle, wherein the first extraction control unit controls the first extraction unit not to extract the pluralities of output logic values during capture cycles which the dummy cycle assignment unit assigns as dummy cycles.

An eighth aspect in accordance with the present invention provides a test pattern generation method using a test pattern generation device for generating a test pattern to be inputted into a circuit under test of scan test, comprising a logic value generation step for generating a new logic value by keeping or reversing a logic value of a second bit included in an initial test pattern, which is a given test pattern, and/or a test pattern generated by the test pattern generation device based on the initial test pattern, referring to a first bit, the second bit, and a third bit included in the initial test pattern and/or the test pattern generated by the test pattern generation device.

A ninth aspect in accordance with the present invention provides a program capable of causing a computer to execute the method of the seventh aspect.

A tenth aspect in accordance with the present invention provides a non-transitory computer-readable medium storing a computer program of the eighth aspect.

Here, the logic value generation unit may generate a logic value 0 or 1 as the new logic value which appears more in the first bit, the second bit and the third bit. Or, the logic value generation unit may generate the new logic value referring to more than 3 bits including the first bit, the second bit and the third bit.

Further, the fault detection system of the sixth aspect may further comprise a second extraction unit for extracting a part of or all of the output logic values stored in the pluralities of individual storing unit via another individual storing unit. Then, the comparison unit may compare an output logic value extracted by the second extraction unit with an output logic value expected when the circuit under test is free from fault or with an output logic value expected when the circuit under test has a specific fault.

Advantageous Effects of Invention

According to each aspect of the present invention, the test pattern generation device generates a logic value of a bit in the new test pattern based on the initial test pattern, that is, an original test pattern which may be a pattern as outputted from LFSR or a pattern captured after outputted from the circuit under test, referring to the logic value of the bit included in the initial test pattern and/or in the test pattern generated based on the initial test pattern. Thus, a new test pattern can be generated keeping the feature of the initial test pattern such as fault coverage as much as possible.

In addition, according to the second aspect of the present invention, a new logic value is generated using a combinational circuit whose input includes a logic value just generated by the combinational circuit itself. Thus, the relation between generated logic values can be easily controlled. In particular, the reverse rate (toggle rate) of logic values of bits spatially or temporally successively lined can be easily reduced or controlled.

The toggle rate has direct relation with power consumption of shift power. So, shift power can be reduced by reducing toggle rate. On the other hand, fault coverage can be increased by increasing the toggle rate. Thus, for example, the test pattern generation device for reducing shift power keeping the feature of the initial test pattern as much as possible can be provided.

If shift power is reduced, heat generation during logic BIST and noise level are decreased, and malfunction during test can be reduced. Besides, the damage to LSI by heat generation can be reduced.

Further, according to the third aspect of the present invention, scan flip-flops in scan chains are utilized as storing units, which requires no additional circuits. Thus, the number of circuits can be kept small.

Further, according to the fourth aspect of the present invention, combinational circuit can be switched among pluralities of logic circuits. By this, it is easier to control favorable features of generated test pattern and shift power reduction. Here, the pluralities of combinational circuits have different toggle rates of test patterns generated based on random test patterns, for example. Then, a test pattern with favorable toggle rate can be generated by switching logic circuits among pluralities of combinational circuits with different toggle rates when generating each bit, according to the distribution of toggle rate of initial test pattern. Further, peak of power consumption can be cut. Therefore, it is possible to balance between keeping the feature of the initial test pattern such as fault coverage and shift power reduction.

In addition, the test pattern generation device described in Non Patent Literature further needs a sequential circuit for generating a test pattern. So, complicated timing control is necessary for the device. To the contrary, the test pattern generation device of the present invention of the fourth aspect only adds combinational circuits to the logic value generation unit. Thus, complex timing control is unnecessary compared with the case where a sequential circuit is added. That is, test pattern can be easily generated with favorable fault coverage and power consumption. Besides, the number of circuits can be reduced compared with the case where sequential circuit is utilized.

Further, according to the fifth invention of the present invention, a new test pattern can be generated referring to the information of test patterns already generated. Thus, toggle rates can be controlled between test patterns.

Further, according to the sixth aspect of the present invention, the multi-capture method and intermediate extraction method can increase fault coverage of a test pattern whose fault coverage has been decreased by the test pattern generation device of any of the first through the sixth aspect in order to decrease toggle rate. Therefore, it is easier to keep fault coverage while reducing toggle rate of a test pattern.

Further, according to the seventh aspect of the present invention, output logic values are extracted after dummy cycles. Thus, an input test pattern generating only small number of transitions can be obtained. As a result, delay fault can be accurately detected while decreasing capture power consumption and noise.

BRIEF DESCRIPTION OF DRAWINGS

FIG. 1(a) illustrates an example of a conceptual diagram of a logical products circuit portion in according with the Example 1. FIG. 1(b) illustrates an example of generating a new test pattern from logic values of pluralities of bits successively lined.

FIG. 2(a) illustrates an example of a conceptual diagram of a logical products circuit portion in accordance with the Example 2. FIG. 2(b) illustrates an example of generating a new test pattern in the Example 2.

FIG. 3(a) illustrates an example of a conceptual diagram of a logical products circuit portion in accordance with the Example 3. FIG. 3(b) illustrates an example of generating a new test pattern in the Example 3.

FIG. 11 illustrates an example of a common concept of each of Examples in terms of selecting a test pattern at an appointed time.

DESCRIPTION OF EMBODIMENTS

Figure 4:
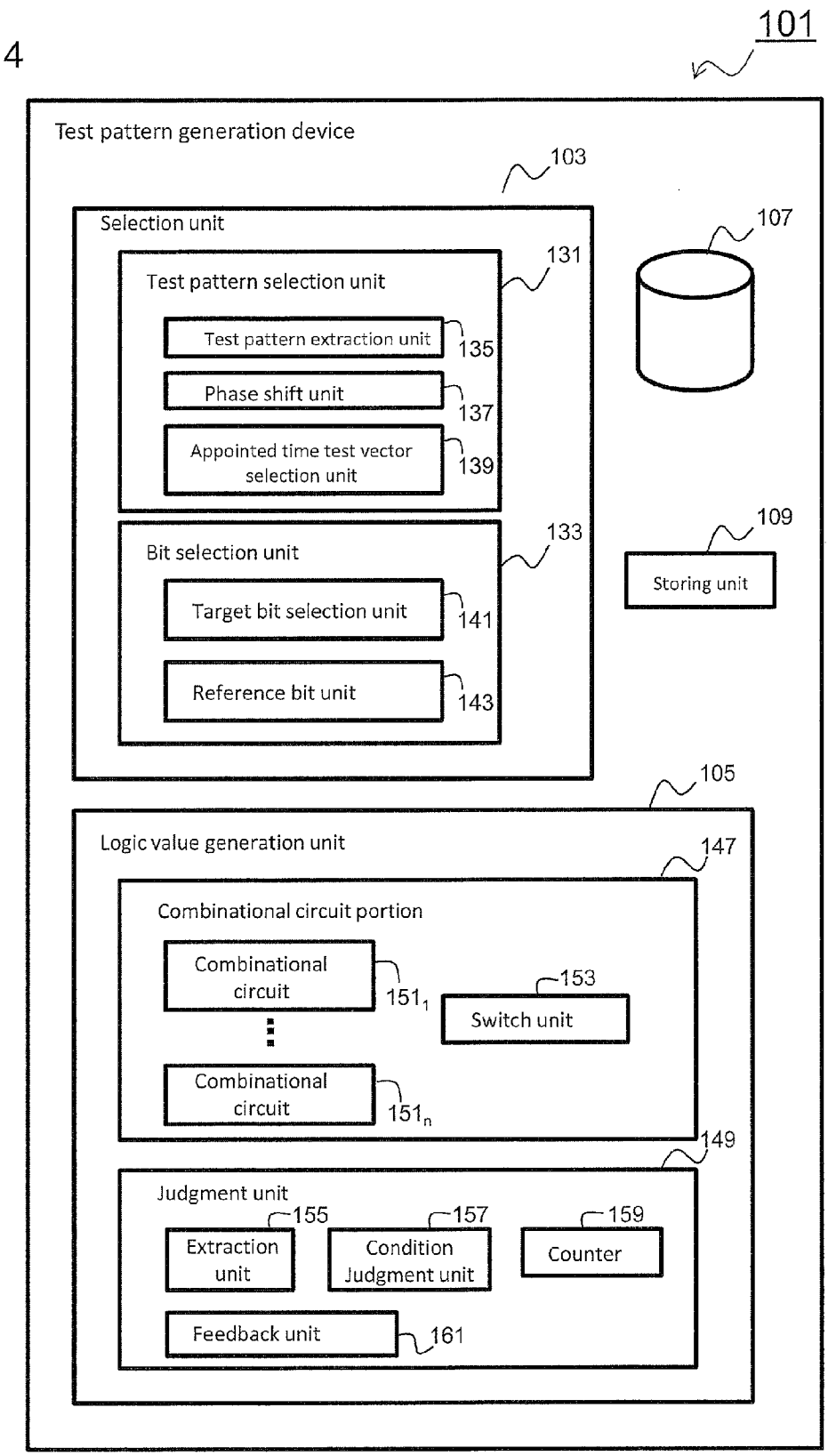
FIG. 4 illustrates a schematic block diagram of a test pattern generation device in accordance with the Example 4.

The embodiments of the present invention is described in the following referring to drawings. Here, the present invention is not restricted to the following examples.

Here, "test vector" denotes a set of bits with logic values to be shifted into one or pluralities of scan chains at the same time. And "test pattern" includes a test vector and pluralities of test vectors. And "initial test pattern" denotes a test pattern given to the test pattern generation device in accordance with the present invention, including a pattern as outputted from LFSR and a pattern captured via the circuit under test.

The symbols such as $T_{-1}$, $T$, $T_1$ are utilized for bits successively lined. Here, "bits successively lined" may be spatially adjacent bits in a single test vector (bits to be shifted into adjacent scan chains) or corresponding bits in pluralities of test vectors generated temporally continuously.

EXAMPLE 1

Referring to FIG. 1, logic value generation in the test pattern generation method using the test pattern generation device in accordance with the present invention is described. FIG. 1(a) illustrates an example of a conceptual diagram of a logical products circuit portion in according with the Example 1. FIG. 1(b) illustrates an example of generating a new test pattern from logic values of pluralities of bits successively lined.

The test pattern generation device in accordance with the present invention includes a logic generation unit $5_1$ (an example of "logic value generation unit" in Claims) for generating a new logic value referring to pluralities of bits, a storing unit 9 for storing the generated new logic values (an example of "storing unit" in Claims). The logic value generation unit $5_1$ refers to each logic value $T_{-1}$, $T$ and $T_1$ of a first bit $2_1$ (an example of "first bit" in Claims), a second bit $2_2$ (an example of "second bit" in Claims), and a third bit $2_3$ (an example of "third bit" in Claims), respectively, (reference bits $2_1$, $2_2$ and $2_3$) which are included in an initial test pattern which is a given test pattern, and generates a new logic value T' by keeping or reversing the logic value T of the second bit $2_2$ (target bit $2_2$). T' is a logic value of a bit (bit 4 in FIG. 1) included in a test pattern generated by the test pattern generation device in accordance with the present invention. The generated logic value T' is stored in the storing unit 9.

It is favorable for bits successively lined to have the same logic value for reducing shift power. Thus, it is favorable that the logic value T' of newly generated bit is the same with logic values $T_{-1}$, $T$ and $T_1$ of bits successively lined as much as possible.

One of the ways to determine such a logic value in an automatic manner is calculating weighted sum of logic values $T_{-1}$, $T$ and $T_1$. Here, it is assumed that weights $\langle_{-1}$, $\langle$ and $\langle_1$ ($\langle_{-1}+\langle+\langle_1=1$, $\langle_{-3}=\langle=\langle_1=⅓$) are equivalent. Then, as shown in Table 1, given that all the three logic values of $T_{-1}$, $T$ and $T_1$ are zero or that only one of them is 1 and the other two are 0, the weighted sum becomes 0 or ⅓, leading to the judgment that T' should be 0. And, given that all the three logic values are zero or that only one of them is 0 and the other two are 1, the weighted sum becomes 1 or ⅔, leading to the judgment that T' should be 1. By judging like this, it is possible to generate the same logic value for T' with the logic values $T_{-1}$, $T$ and $T_1$ of the successive bits as much as possible.

TABLE 1

| $T_{-1}TT_1$ | Weighted sum | → | T' |
|---|---|---|---|
| 000 | 0 | → | 0 |
| 001 | 1/3 | → | 0 |
| 010 | 1/3 | → | 0 |
| 011 | 2/3 | → | 1 |
| 100 | 0 | → | 0 |
| 101 | 2/3 | → | 1 |
| 110 | 2/3 | → | 1 |
| 111 | 1 | → | 1 |

Here, in order to implement the above judgment in a logic circuit, the combinational circuit of the logic value generation unit may be configured as a circuit corresponding to the logical formula shown in formula (1) or the circuit equivalent therewith. Here, in the formula (1), '&' corresponds to AND circuit and '+' corresponds to OR circuit.

Equation 1

$$T'=T_{-1}\&T+T_{-1}\&T_1+T\&T_1 \quad (1)$$

Here, by the logic value generation method shown in FIG. 1, frequent reversal part (called as "high frequency component" in the following) of logic values of bits successively lined are not necessarily excluded. For example, as shown in FIG. 1(b), as for the part where logic values are reversed one by one such as 010101, the values are only shifted leaving the high frequency component. If shift power reduction is the only purpose, test pattern generation for reducing high frequency components as much as possible is favorable.

EXAMPLE 2

Then, referring to FIG. 2, the logic value generation method partly modified from the method of FIG. 1 is described. FIG. 2 illustrates an example of a logic value generation unit $5_2$ in accordance with Example 2. FIG. 2(b) illustrates an example of generating a new test pattern in the Example 2.

In the method of FIG. 1, the logic value generation unit 51 generates a new logic value referring to logic values of three bits. Compared with this, in the method of FIG. 2, as shown in FIG. 2(a), the logic value generation unit $5_2$ (an example of "logic value generation unit" in Claims) refers additionally to a logic value $T_2$ of a bit $2_4$ further successively lined to the three bits, only if the high frequency component of 010 appears. That is, as shown in Table 2, if the logic values $T_{-1}$, T and $T_1$ are 010 and if $T_2$ is 1, 1 is generated as T'. On the other hand, if $T_2$ is 0, 0 is generated. The logical formula for generating a logic value referring to four bits like this is given by formula (2). Here, if the high frequency component of 101 appears in the logic values $T_{-1}$, T and $T_1$ of the reference bits $2_1$, $2_2$ and $2_3$, the total weighted sum equals to or more than 2/4 regardless of the logic value of $T_2$ and the logic value T' becomes 1. Thus, if the high frequency component of 101 appears in the logic values $T_{-1}$, T and $T_1$, it is unnecessary to refer to the logic value $T_2$ of the bit $2_4$.

TABLE 2

| $T_{-1}TT_1$ | $T_2$ | Weighted sum | → | T' |
|---|---|---|---|---|
| 000 |  | 0 | → | 0 |
| 001 |  | 1/3 | → | 0 |
| 010 | 0 | 1/4 | → | 0 |
|  | 1 | 1/2 | → | 1 |
| 011 |  | 2/3 | → | 1 |
| 100 |  | 0 | → | 0 |
| 101 |  | 2/3 | → | 1 |
| 110 |  | 2/3 | → | 1 |
| 111 |  | 1 | → | 1 |

Equation 2

$$T'=T_{-1}\&T+T_{-1}\&T_1+T\&T_1+T\&T_2 \quad (2)$$

As shown in FIG. 2(b), by using the method of FIG. 2, it is possible to generate a test pattern from which the high frequency component such as 01010 is removed. In contrast, that high frequency component is remained in the method of FIG. 1.

EXAMPLE 3

Next, referring to FIG. 3, another example of test pattern generation in accordance with the present invention is described. FIG. 3(a) illustrates an example of a conceptual diagram of a logical products circuit portion in accordance with the Example 3. FIG. 3(b) illustrates an example of generating a new test pattern in the Example 3.

Referring to FIG. 3, in the present example, a logic value generation unit $5_3$ (an example of "logic value generation unit" in Claims) generates a new logic value referring to logic values of three input bits $2_1$, $2_2$ and $2_3$. Here, the rule to generate logic values is the same with that of Example 1. The logic value T' of a newly generated bit can be expressed by formula (3). However, as shown in FIG. 3(a), the logic value of the bit $2_1$, which is one of the three input bits, comes from a bit $4_1$ stored in the storing unit 9 (an example of "storing unit" in Claims). Here, the logic value of the bit $4_1$ is the logic value $T'_{-1}$ which is newly generated for the bit $2_1$ which is previously next to the target bit $2_2$.

Equation 3

$$T'=T'_{-1}\&T+T'_{-1}\&T_1+T\&T_1 \quad (3)$$

FIG. 3(b) illustrates an example of generated test pattern when the initial value of $T'_{-1}$ is 1. Even if the high frequency components 10101 are reference bits, which is remained as high frequency components by the method of Example 1, the pattern 11111 is generated. Like this, by inputting the previously generated logic value as one of reference bits, it is possible to reduce high frequency components in a newly generated test pattern. Besides, unlike the method of Example 2, it is possible to keep the number of reference bits as three for the logic values of any input bits.

In the following, the results of reducing high frequency components by the methods of Example 1 through 3 are compared. The logic values T' and T': of new bits are generated as new logic values of target bits T and $T_1$ referring to logic values $T_{-1}$, T, $T_1$, $T_2$ and $T_3$ of five bits successively lined.

As shown in Table 3, the number of possible outcomes where the logic values T and $T_1$ of target bits are 10 out of 18 possibilities shown in Table 3 (See #3-7 and #12-16). In contrast, by using the methods of Example 1, 2 or 3, the number of outcomes decreases down to 5, 4 or 2, respectively. See #5, 7, 12, 13 and 15 as for Example 1. See #4, 5, 12 and 15 as for Example 2. See #5 and 15 as for Example 3. That is, it is shown that by all the methods, the toggle rate is reduced in the generated test pattern compared with the initial test pattern. In addition, it is also shown that the method of Example 3 is the most effective.

It is also shown in Table 3 that the generated test patterns by the method of Example 1 through 3 keep the features of the initial test pattern. For example, the logic values of bits which have the same logic values 00 or 11 for T and T1 in the initial test pattern are also the same 00 or 11 also in the newly generated test pattern (See #1, 2, 8-11, 17 and 18). That is, by the generation methods of any Example, compared with the initial test pattern, a new test pattern is generated without increasing shift power.

Besides, the test pattern generated in Example 2 has less number of reverse of bits than that of Example 1. Plus, the test pattern generated in Example 2 is closer to the initial test pattern than that of Example 1, which means keeping more features of the initial test pattern (See #4, 7, 13). It is also shown that the test pattern generated in Example 3 also keeps more features of the initial test pattern compared with that of Example 1 (See #7, 12, 13).

TABLE 3

| # | Initial test pattern $T_{-1}TT_1T_2$ | $T_3$ | Example 1 $T'$ | | Example 2 $T'$ $T_1'$ | | Example 3 $T'$ $T_1'$ | | Initial $TT_1$ |
|---|---|---|---|---|---|---|---|---|---|
| 1 | 0000 |  | 0 | 0 | 0 | 0 | 0 | 0 | 00 |
| 2 | 0001 |  | 0 | 0 | 0 | 0 | 0 | 0 | 00 |
| 3 | 0010 | 0 | 0 | 0 | 0 | 0 | 0 | 0 | 01 |
| 4 |  | 1 | 0 | 0 | 0 → | 1 | 0 | 0 | 01 |
| 5 | 0011 |  | 0 → | 1 | 0 → | 1 | 0 → | 1 | 01 |
| 6 | 0100 |  | 0 | 0 | 0 | 0 | 0 | 0 | 10 |
| 7 | 0101 |  | 0 → | 1 | 1 | 1 | 0 | 0 | 10 |
| 8 | 0110 |  | 1 | 1 | 1 | 1 | 1 | 1 | 11 |
| 9 | 0111 |  | 1 | 1 | 1 | 1 | 1 | 1 | 11 |
| 10 | 1000 |  | 0 | 0 | 0 | 0 | 0 | 0 | 00 |
| 11 | 1001 |  | 0 | 0 | 0 | 0 | 0 | 0 | 00 |
| 12 | 1010 | 0 | 1 → | 0 | 1 → | 0 | 1 | 1 | 01 |
| 13 |  | 1 | 1 → | 0 | 1 | 1 | 1 | 1 | 01 |
| 14 | 1011 |  | 1 | 1 | 1 | 1 | 1 | 1 | 01 |
| 15 | 1100 |  | 1 → | 0 | 1 → | 0 | 1 → | 0 | 10 |
| 16 | 1101 |  | 1 | 1 | 1 | 1 | 1 | 1 | 10 |
| 17 | 1110 |  | 1 | 1 | 1 | 1 | 1 | 1 | 11 |
| 18 | 1111 |  | 1 | 1 | 1 | 1 | 1 | 1 | 11 |

As compared above, the method of Example 2 decreases toggle rate better than that of Example 1. The method of Example 3 decreases toggle rate even better. In addition, the methods of Example 2 and 3 keep the feature of the initial test pattern better than that of Example 1. Further, compared to the method of Example 2, which sometimes refers to four bits as reference bits, the method of Example 3 refers to only three bits just like that of Example 1.

Here, the test pattern generation device of Example 1 through 3 may include a reference bit selection unit for selecting reference bits of the first bit 21, the second bit 22 and the third bit 23. In addition, the test pattern generation device may include a target bit selection unit for selecting target bit 22 among the bits of the initial test pattern. And the test pattern generation device may include a storing unit for storing an initial test pattern and/or a generated test pattern.

EXAMPLE 4

Here, the high frequency component in a test pattern is not necessarily a bad thing. Usually, the memory unit 7 memorizes test patterns of high fault coverage for testing purpose. If all the high frequency components are removed, the fault coverage can decrease to a large degree. Thus, it is favorable to adjust the degree of fault coverage and high frequency component removal adequately for purposes, as well as controlling the shift power under acceptable level.

Figure 5:
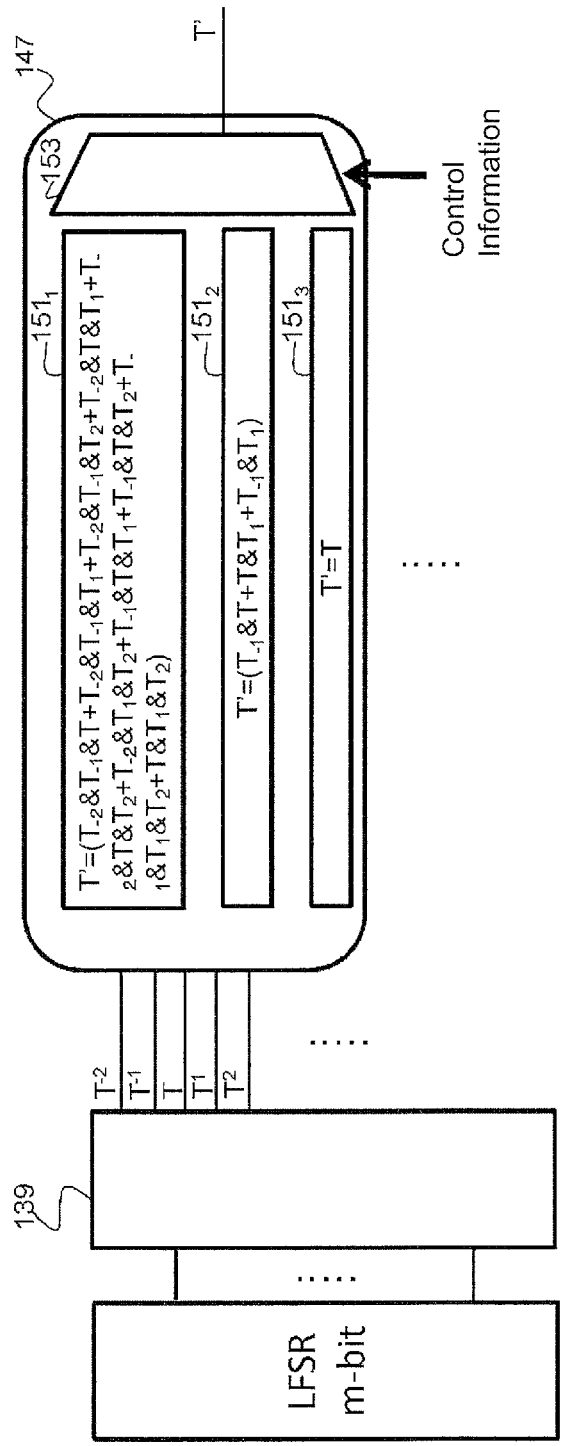
FIG. 5 illustrates an example of configuration of selecting a reduction circuit receiving a feedback.
Figure 6:
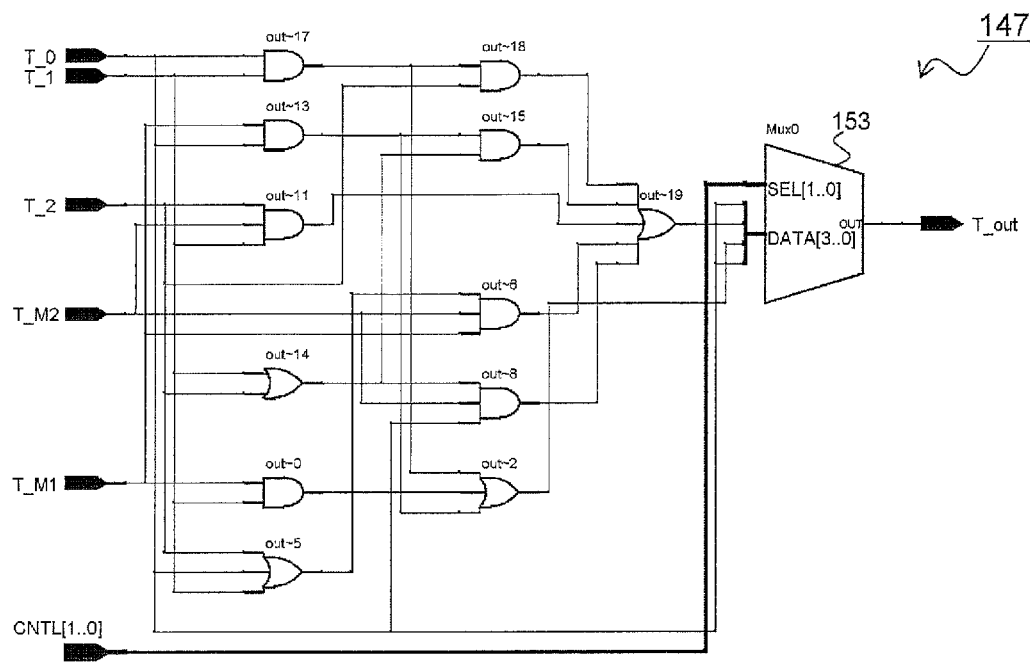
FIG. 6 illustrates an example of selecting circuits in a combinational circuit portion.
Figure 7:
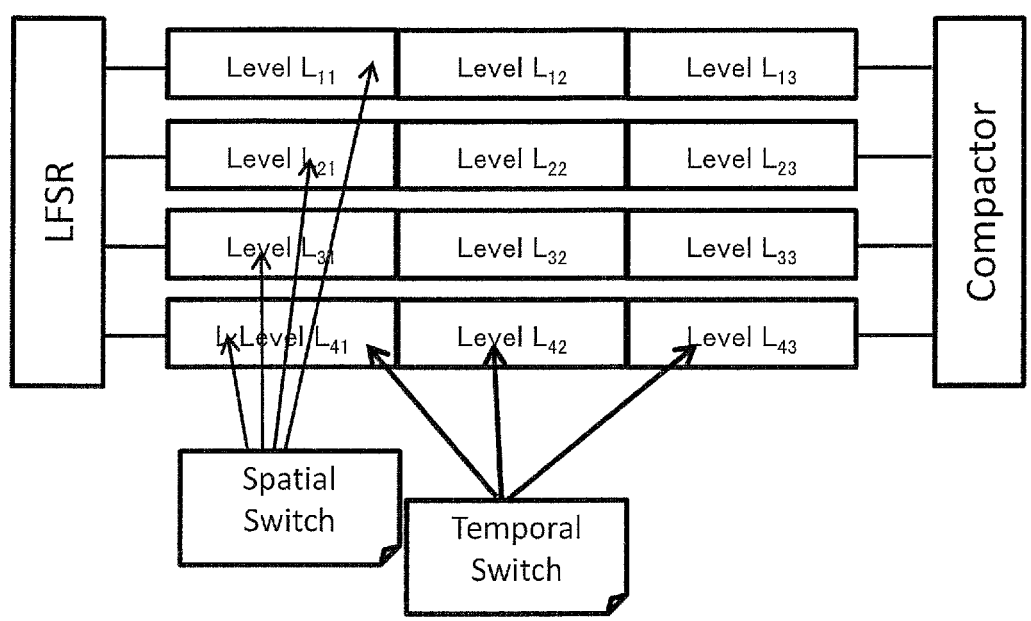
FIG. 7 illustrates a conceptual diagram of controlling the feature of a test pattern spatially and temporally.

Then, referring to FIG. 4 through 7, adjusting the fault coverage and the shift power using the test pattern generation device in accordance with the present invention is described. FIG. 4 illustrates a schematic block diagram of a test pattern generation device 101 in accordance with the Example 4. FIG. 5 illustrates an example of configuration of selecting a reduction circuit (an example of "combinational circuit" in Claims). FIG. 6 illustrates an example of a logic circuit which can select among reduction circuits. FIG. 7 illustrates a conceptual diagram of controlling the feature of a test pattern spatially and temporally.

Referring to FIG. 4, the test pattern generation device 101 (an example of "test pattern generation device" in Claims) includes a selection unit 103 for selecting necessary information for generating a test pattern, a logic value generation unit 105 (an example of "logic value generation unit" in Claims) for generating a logic value of a test pattern, a memory unit 107 (an example of "memory unit" in Claims) for memorizing a test pattern, a storing unit 109 (an example of "storing unit" in Claims) for storing the generated logic value.

The selection unit 103 includes a test pattern selection unit 131 for selecting an initial test pattern necessary for generating a new test pattern and a bit selection unit 133 for selecting bits necessary as well. The test pattern selection unit 131 includes a test pattern extraction unit 135 for extracting a test pattern from the memory unit 107, a phase shift unit 137 for shifting phases of a test pattern, and an appointed time test vector selection unit 139 for selecting a test vector at an appointed time. The bit selection unit 133 includes a target bit selection unit 141 for selecting a bit in a selected test pattern, the bit for which the logic value generation unit 105 generates a logic value. The bit selection unit 133 also includes a reference bit selection unit 143 for selecting reference bits which are referred by the logic value generation unit 105 when it generates a logic value.

The logic value generation unit 105 includes a combinational circuit portion 147 which is a combinational circuit for generating logic values. The logic value generation unit 105 also includes a judgment unit 149 for judging if generated test patterns meet conditions. The combinational circuit portion 147 includes combinational circuits $151_1 \ldots 151_n$ (n denotes natural number) which outputs new logic values based on one or pluralities of logic values inputted into the combinational circuit portion 147, and a switch unit 153 (an example of "switch unit" in Claims) for switching circuits among pluralities of combinational circuits $151_1, \ldots 151_n$. The judging unit 149 includes an extraction unit (an example of "extraction unit" in Claims) for extracting one or pluralities of bits from a generated test pattern, a condition judgment unit 157 (an example of "condition judgment unit" in Claims) for judging if the bits extracted by the extraction unit 155 meet conditions, a counter 159 for counting the number of judgment by the condition judgment unit 157 as "meet conditions" and/or as "don't meet conditions," and a feedback unit 161 (an example of "feedback unit" in Claims) for feeding back information based on the counted number by the counter 159 to the switch unit 153.

Next, the adjustment of the toggle rate of generated test pattern is described. As shown in FIG. 5, the switch unit 153 switches circuits based on control information among combinational circuits $151_1$, $151_2$ and $151_3$. And the switch unit 153 can switch circuits as often as a bit is generated. Besides, the pluralities of combinational circuits $151_1$, $151_2$ and $151_3$ don't have to be totally discrete circuits and may be logically synthesized circuits which have circuits partly in common.

By the configuration described above, the conditioned determined by the condition judgment unit 157 is reflected to test pattern generation. As an example of application, it is possible to generate a test pattern with maximum fault coverage under a specific condition such as "toggle rate must be below 20%."

FIG. 6 illustrates an example of the combinational circuit 147 in accordance with the present example. It is assumed that, for example, 3 levels are set for an output logic value T' of 5 input bits, as shown in Table 4. The toggle rate of a logic circuit corresponding to level 2 is expected to be statistically 6.7% if the number of output logic values is large enough. Similarly, the toggle rates of logic circuits corresponding to level 1 and 0 are expected to be 12.5% and 50%, respectively. Thus, by synthesizing these logic circuits of level 0, 1 and 2, the toggle rate of a generated test pattern can be adjusted from 6.7% through 50%. For example, given that the ratio of utilizing logic circuits of level 0, 1 and 2 for generating T' is 1−⟨−®, ⟨ and ®, respectively, the toggle rate p which is statistically expected when the number of output logic values is large enough can be expressed by formula (4). By determining adequate value of ⟨ and ®, intended value of p can be gained.

Concretely, if 3 levels are classified as above, by using the combinational portion 147 exemplified in FIG. 6, any level of circuit can be selected based on control information. That is, based on 2-bit control information CNTL[1.0] to a multiplexor (an example of the switch unit 153) of the combinational circuit portion 147, the output selection among the combinational circuits $151_1$, $151_2$ and $151_3$ is switched and a new logic value T' is generated.

Here, the circuit shown in FIG. 6 is made from logic synthesis of the circuits corresponding to the 3 levels. T_0 corresponds to T, T_1 corresponds to $T_1$, T_2 corresponds to $T_2$, T_M1 corresponds to $T_{-1}$, T_M2 corresponds to $T_{-2}$, and T_out corresponds to T'.

Equation 4

$$p=(1-\alpha-\beta)\times 0.50+\alpha\times 0.125+\beta\times 0.067 \quad (4)$$

TABLE 4

| Level | Logical formula |
|---|---|
| 2 | If CNTL[1:0]=(1,0),<br>T'=($T_{-2}$&$T_{-1}$&T+$T_{-2}$&$T_{-1}$&$T_1$+$T_{-2}$&$T_{-1}$&$T_2$+<br>$T_{-2}$&T&$T_1$+$T_{-2}$&T&$T_2$+<br>$T_{-2}$&$T_1$&$T_2$+<br>$T_{-1}$&T&$T_1$+$T_{-1}$&T&$T_2$+$T_{-1}$&$T_1$&$T_2$+<br>T&$T_1$&$T_2$) |
| 1 | If CNTL[1:0]=(0,1),<br>T'=($T_{-1}$&T+T&$T_1$+$T_{-1}$&$T_1$) |
| 0 | if CNTL[1:0]=(0,0) or (1,1)<br>T'=T |

Thus, as shown in FIG. 7, toggle rate can be adjusted between spatially adjacent scan chains to which logic values of bits in a test vector are inputted. Then, the spatial variation of toggle rates can be reduced. Thus, it is possible to reduce instantaneous concentration and variation of load voltage. Here, "spatially adjacent" logic values mean logic values which are inputted into scan chains which are spatially adjacent.

In addition, it is also possible to adjacent toggle rates by controlling logic values inputted into each scan chain temporally continuously. Then, the temporal variation of toggle rates can be reduced. Thus, it is also possible to smooth peaks of power consumption. Here, "temporally continuous" logic values mean logic values which are inputted into a circuit under test via the same scan chain temporally continuously.

Figure 8:
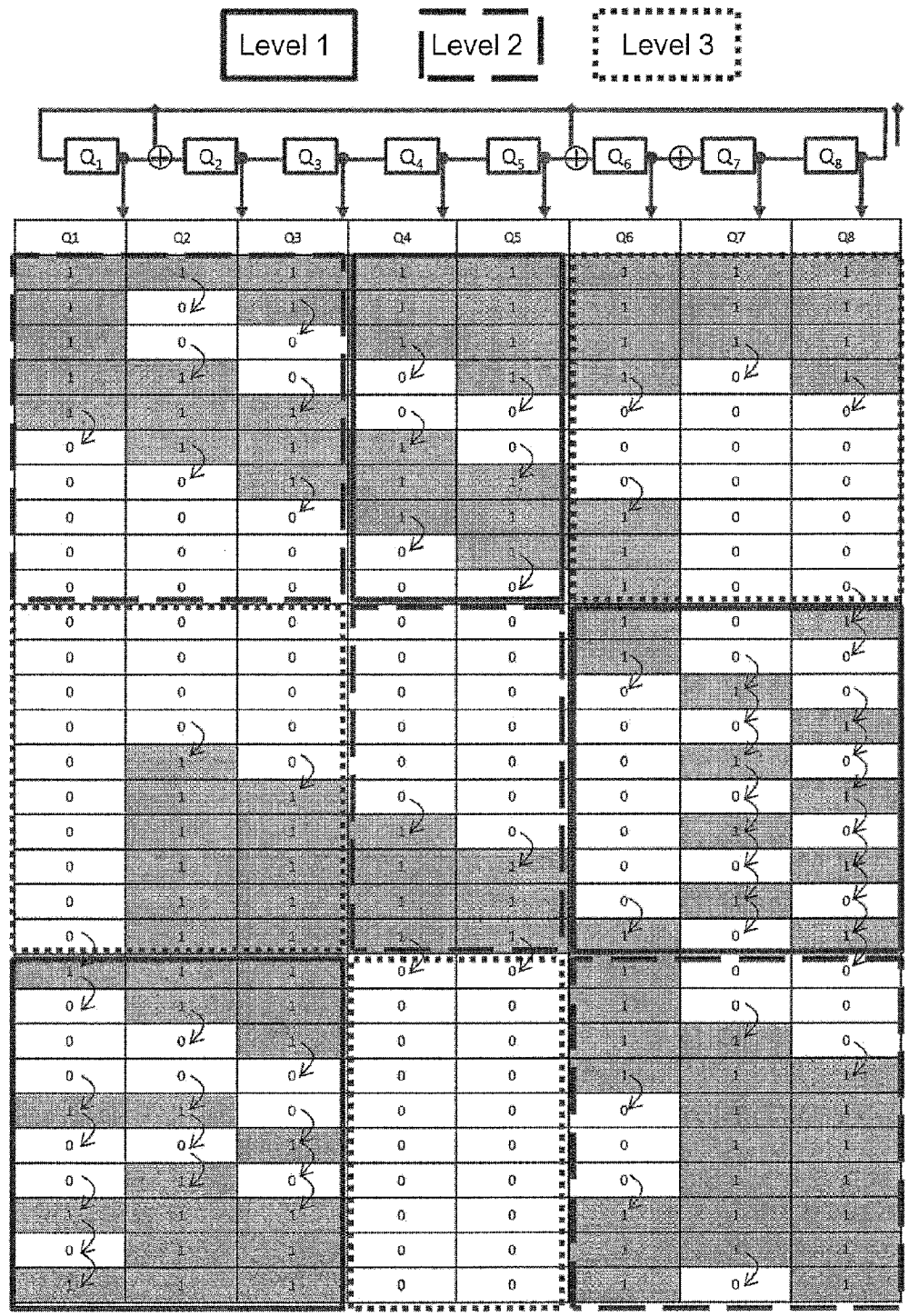
FIG. 8 illustrates an example of a test pattern generated by the test pattern generation device in accordance with the present invention.
Figure 9:
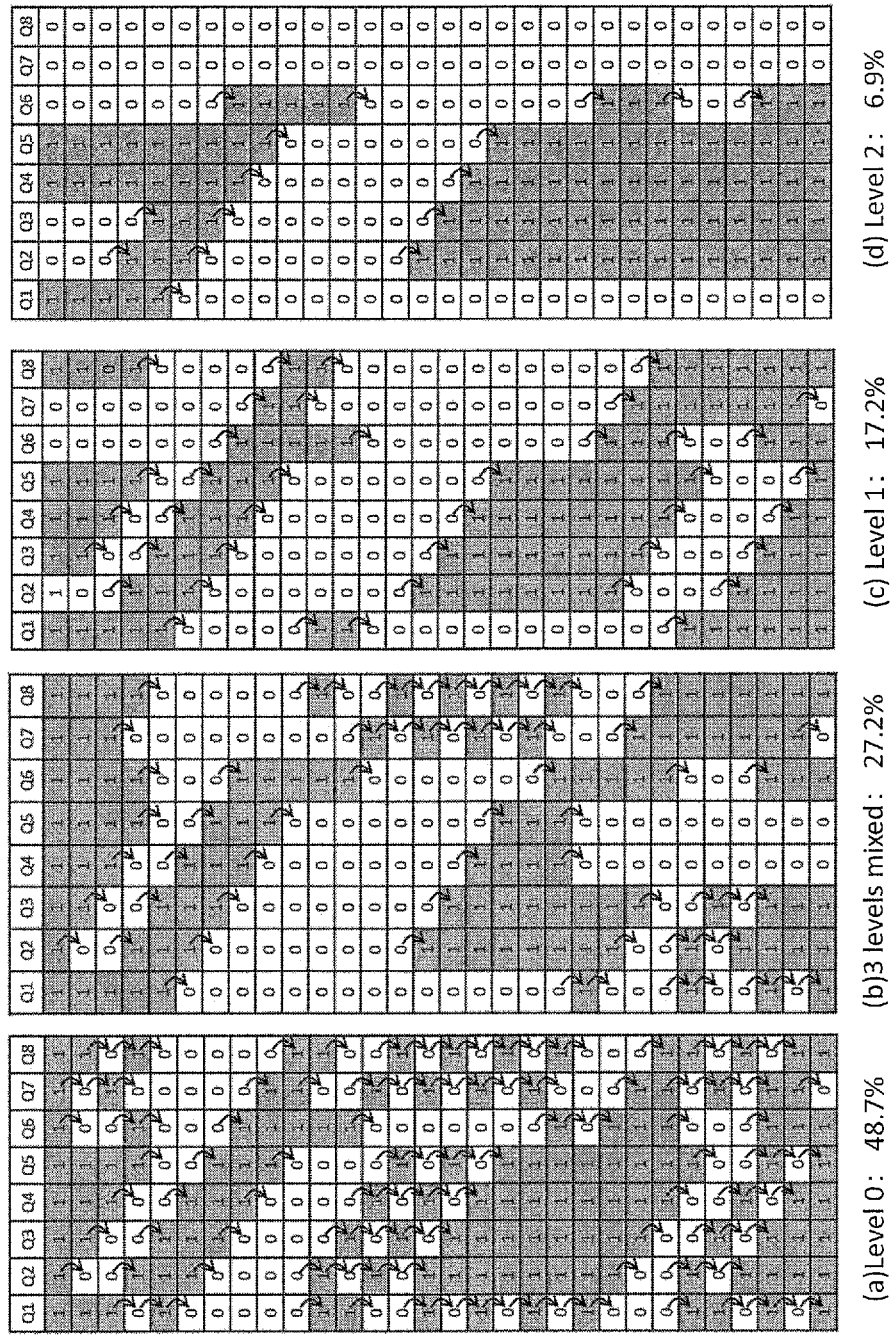
FIG. 9 illustrates a diagram comparing test patterns generated at pluralities of levels.

Next, referring to FIGS. 8 and 9, test patterns generated by the test pattern generation device in accordance with each Example of the present invention described above. FIG. 8 illustrates an example of a test pattern generated by the test pattern generation device in accordance with the present invention. FIG. 9 illustrates a diagram comparing test patterns generated at pluralities of levels.

As shown in FIG. 8, by utilizing the test pattern generation device in accordance with the present example, it is possible to generate a test pattern with logic values generated using the combinational circuits of spatially and/or temporally different levels. In FIG. 8, the numbers in the same row belong to the same test vector. The test vectors in upper line are earlier generated. The numbers in the same column are shifted into the same scan chain sequentially.

The test pattern in FIG. 8 is composed of output logic values outputted from pluralities of combinational circuits of different levels. The logic values surrounded by solid lines are output logic values from the combinational circuit corresponding to level 0. The logic values surrounded by dashed lines are output logic values from the combinational circuit corresponding to level 1. The logic values surrounded by dotted lines are output logic values from the combinational circuit corresponding to level 2. It is shown that test patterns with different toggle rates are generated according to levels. FIG. 8 indicates the case where a=b=⅓. From formula (4), the toggle rate p expected statistically is about 23%. In FIG. 8, the toggle rate is calculated by 63/(8*29)=27.2(%), which is near to the expected value.

Besides, as shown in FIG. 9, it is possible to generate test patterns with different fault coverages and toggle rates by using combinational circuits of different levels. FIG. 9(a) illustrates the test pattern corresponding to the combinational circuit of level 0 shown in Table 4. FIG. 9(b) illustrates the test pattern generated by switching combinational circuits from level 0 through 2, which is the same with that shown in FIG. 8. FIG. 9(c) illustrates the test pattern corresponding to the combinational circuit of level 1. FIG. 9(d) illustrates the test pattern corresponding to the combinational circuit of level 2. It is illustrated that the toggle rate differs according to levels. The toggle rates shown in FIG. 9 are (a) 48.7%, (b) 27.2%, (c) 17.2%, and (d) 6.9%.

EXAMPLE 5

Figure 10:
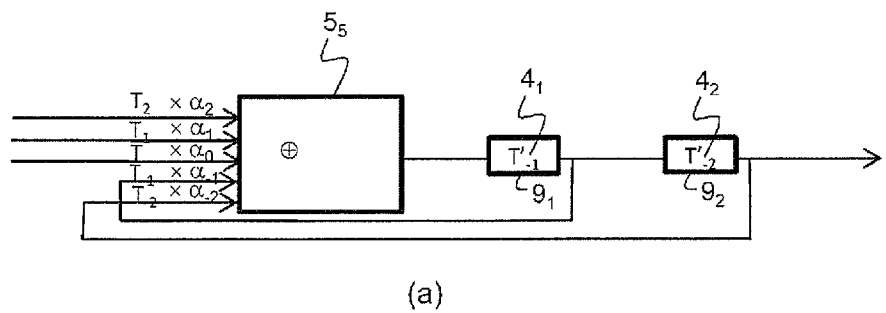
FIG. 10(a) illustrates an example of a conceptual diagram of a logical products circuit portion in accordance with the Example 5.
FIG. 10(b) illustrates an example of a set of rules to generate new logic values from logic values of pluralities of reference bits.

In the following, referring to FIG. 10 and FIG. 11, the case where more inputs are inputted into the logic value generation unit. FIG. 10(a) illustrates an example of a conceptual diagram of an logic value generation unit $5_5$ in accordance with the Example 5. FIG. 10(b) illustrates an example of a set of rules to generate new logic values from logic values of pluralities of reference bits in FIG. 10(a). FIG. 11(a) illustrates another example of logic value generation unit in accordance with the Example 5. FIG. 11(b) illustrates an example of a set of rules to generate new logic values from logic values of pluralities of reference bits in FIG. 11(a).

Referring to FIG. 10(a), logic values of 3 bits among logic values $T_{-2}$, $T_{-1}$, T, $T_1$, $T_2$ of 5 bits are inputted from outside into the logic value generation unit $5_5$ (an example of "logic value generation unit" in Claims), and the other 2 bits are fed back from the logic values $T'_{-1}$ and $T'_{-2}$ of bits $4_1$ and $4_2$ generated previously. Here, by giving the role of storing units $9_1$ and $9_2$ for storing $T'_{-1}$ and $T'_{-2}$ to the scan flip-flops in scan chains, it is possible to simplify the circuit.

In the present example, too, the weighted sum of logic values $T_{-2}$, $T_{-1}$, T, $T_1$ and $T_2$ is calculated. The weights $a_{-1}$, a, $a_1$ ($a_{-2}+a_{-1}+a+a_1+a_2=1$, $a_{-2}=a_{-1}=a=a_1=a_2=\frac{1}{5}$) are assumed to be equivalent. That is, as shown in FIG. 10(b), 3 bits or more among 5 input bits are 1, 1 is output. If otherwise, 0 is output.

The logic value T' of this new bit is expressed by the sum of $_5C_3$ (=10) logical ANDs, as shown in formula (5-1). Here, in formula (5-2), the underlined part shows the part in common with the logic formula of the method in FIG. 3 where 3 bits are input.

Equation 5

$$T' = T_{-2} \& T_{-1} \& T + T_{-2} \& T_{-1} \& T_1 + T_{-2} \& T_{-1} \& T_2 + \quad (5\text{-}1)$$
$$T_{-2} \& T \& T_1 + T_{-2} \& T \& T_2 + T_{-2} \& T_1 \& T_2 + T_{-1} \& T \& T_1 +$$
$$T_{-1} \& T \& T_2 + T_1 \& T_1 \& T_2 + T \& T_1 \& T_2$$
$$= \underline{(T_{-1} \& T + T \& T_1 + T_{-1} \& T_1)} \& (T_{-2} + T_2) + \quad (5\text{-}2)$$
$$(T_{-1} + T + T_1) \& T_{-2} \& T_2 + T_{-1} \& T \& T_1$$

Figure 12:
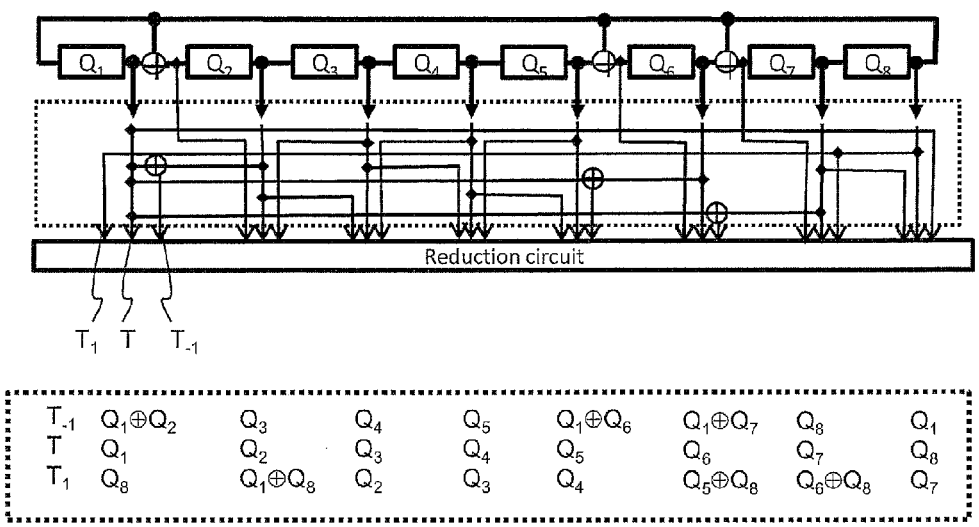
FIG. 12 illustrates an example of appointed time test vector selection in accordance with the Example 1.
Figure 13:
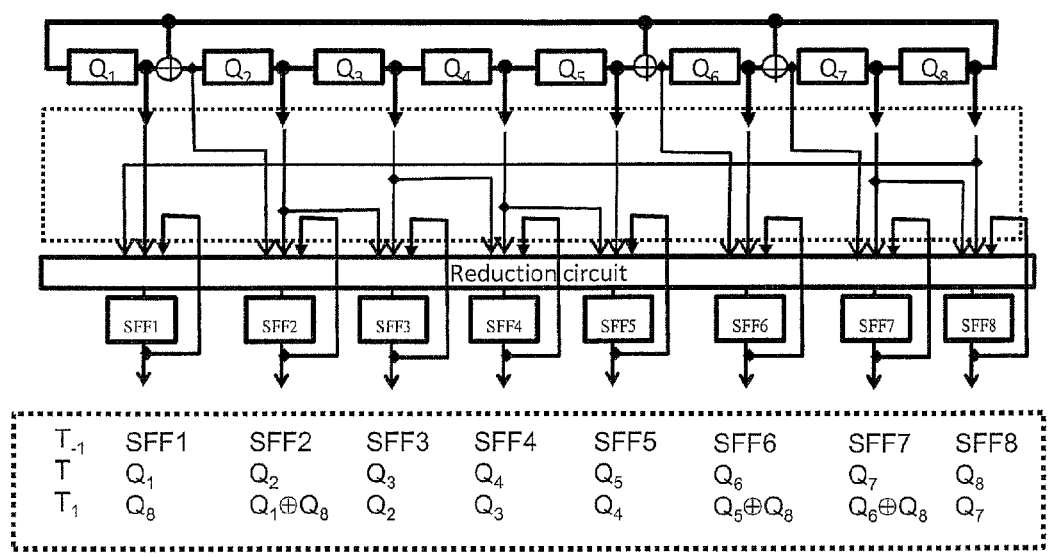
FIG. 13 illustrates an example of appointed time test vector selection in accordance with the Example 3.

Next, referring to FIG. 11 through FIG. 13, the method for extracting a test vector at an appointed time in each Example is concretely described. FIG. 11 illustrates an example of a common concept of each of Examples in terms of selecting a test vector at an appointed time. FIG. 12 illustrates an example of appointed time test vector selection in accordance with the Example 1. FIG. 13 illustrates an example of appointed time test vector selection in accordance with the Example 3.

In FIG. 11, a test vector is assumed to be composed of 8 bits $Q_1$ through $Q_8$. When generating a test vector from the previous vector, the original logic value of a bit is shifted as the logic value of a next bit with the next order. Here, the logic value of Q8 is shifted to Q1. At the same time, for the bits of $Q_2$, $Q_6$ and $Q_7$, new logic values are generated as the exclusive OR of the logic values of $Q_1$ and $Q_8$, $Q_5$ and $Q_8$, and $Q_6$ and $Q_8$, respectively.

As above, by formulating the generation of test vectors at time $T_{-2}$, $T_{-1}$, T, $T_1$, $T_2$ . . . , it is possible to select a test vector at an appointed time in the past or in the future, as well as the test pattern previously generated.

Referring to FIG. 12, the selection of a test vector at an appointed time in the method of Example shown in FIG. 1 is concretely described. 2 bits among 3 input bits into a reduction circuit are input without change. The input of the other 1 bit is given by the exclusive OR of 2 bits. For example, it is assumed that the logic values T of an 8-bit test vector at time t are $Q_1$, $Q_2$ . . . $Q_8$. Then, as shown in FIG. 12, the logic values $T_1$ at the next time $t_1$ from time t are $Q_8$, $Q_1$ (XOR) $Q_8$, $Q_2$, $Q_3$, $Q_4$, $Q_5$ (XOR) $Q_8$, $Q_6$ (XOR) $Q_8$, and $Q_7$, respectively. Similarly, the logic values $T_{-1}$ at the previous time $t_{-1}$ of time t are $Q_1$ (XOR) $Q_2$, $Q_3$, $Q_4$, $Q_5$, $Q_1$ (XOR) $Q_6$, $Q_1$ (XOR) $Q_7$, $Q_8$, and $Q_1$, respectively. Here, A (XOR) B denotes the exclusive OR of A and B.

Here, when extracting 3 input bits into the combinational portion into TAP (Test Access Port), the input circuits for the 3 bits are needed. In order for the increase of fault coverage of initial test patterns, one possibility is inserting exclusive ORs to generate a test vector at next time with more random logic values. For example, if the values in adjacent scan chains are not simply shifted at next time and 3 XOR gate circuits with 2 input bits are inserted, the overhead of the circuit increases. As described in the following, by adopting the method of Example 3, the overhead of the circuit is improved.

Referring to FIG. 13, the test pattern generation in Example 3 is concretely described. 2 bits among 3 input bits into a reduction circuit (an example of the combinational circuit portion 51) are input without change. The input of the other 1 bit is given by feedback of output at the previous time. Then, there is no need to insert an XOR gate circuit. Thus, in contrast to the logic circuit shown in FIG. 12 where the exclusive OR of pluralities of bits is adopted, the overhead of the circuit is suppressed at minimum.

Here, in order to feed back the logic value $T'_{-1}$, it is necessary to store a logic value. One possibility is utilizing the value in a scan flip-flop (SFF) as the input into the combinational circuit portion. By using feedback from the scan flip-flop, it is unnecessary to add a new sequential circuit. Thus, new complex control such as timing control is not needed. Besides, it is favorable for suppressing the overhead of the circuit.

By the configuration described above, the method of Example 3 is favorable in reducing toggle rate, keeping the feature of an initial test pattern and suppressing the overhead of a circuit at minimum.

Next, the features of test patterns generated using the methods of Example 1 (FIG. 1) and Example 2 (FIG. 3) at 5-bit input are described referring to Tables. Table 5 shows a list of toggle rates (%) of generated test patterns. Table 6 shows a list of fault coverages (%) of test patterns in Table 5. Table 7 shows the fault coverages when multi-capture is repeated five times and logic values are intermediately extracted from 20% FF. Here, 'LFSR' in Tables denotes the initial test patterns as outputted from LFSR.

Referring to Table 5, for each circuit under test, the toggle rates are decreased in a large amount compared to that of initial test pattern by using the method of Example 1. Plus, it is also shown that for each circuit under test, the toggle rate is even less by using the method of Example 3.

TABLE 5

| Circuit | LFSR | Example 1 5-bit | Example 3 5-bit |
|---|---|---|---|
| s38417 | 47.46 | 24.21 | 15.27 |
| s38584 | 48.95 | 22.96 | 13.30 |
| b20s | 49.55 | 20.79 | 9.74 |
| b21s | 49.55 | 20.80 | 9.83 |

Referring to Table 6, it is shown that the fault coverage is usually positively correlated with toggle rate. However, in some circuits, the fault coverage becomes higher by the method of Example 1 than that of the initial test pattern. This is noticeable effect because the toggle rate becomes smaller than that of the initial test pattern.

TABLE 6

| Circuit | LFSR | Example 1 5-bit | Example 3 5-bit |
|---|---|---|---|
| s38417 | 92.64 | 92.43 | 89.73 |
| s38584 | 90.96 | 90.11 | 83.58 |
| b20s | 84.09 | 86.43 | 80.66 |
| b21s | 85.80 | 87.88 | 82.05 |

Further, referring to Table 7, the fault coverages gained when multi-capture is repeated five times for a test pattern and logic values are intermediately extracted from 20% FF. The intermediate extraction during multi-capture is developed by the present inventors (See Japanese Patent Application No. 2010-225318, for example). In the multi-capture method, capturing is repeated in capture mode. By intermediate extraction method, pluralities of output patterns are gained from a single input test pattern, by observing not only the logic values lastly captured after pluralities of captures in the capture mode but also a part of or all of the pluralities of logic values gained by flip-flops at each capture. By this method, it is possible to test pluralities of times with a single input test pattern. Thus, it is possible to increase the fault coverage compared to the case where only the final output pattern is observed.

In fact, each of the fault coverages in Table 7 indicates the increase compared to those in Table 6. Thus, even when the toggle rate of a test pattern is reduced using the method in accordance with the present examples, by using the intermediate extraction method, too, it is possible to soften the fault coverage decrease.

TABLE 7

| Circuit | LFSR | Example 1 5-bit | Example 3 5-bit |
|---|---|---|---|
| s38417 | 95.47 | 94.41 | 92.60 |
| s38584 | 91.15 | 90.74 | 87.08 |
| b20s | 88.14 | 91.07 | 91.18 |
| b21s | 89.49 | 91.83 | 91.91 |

Figure 14:
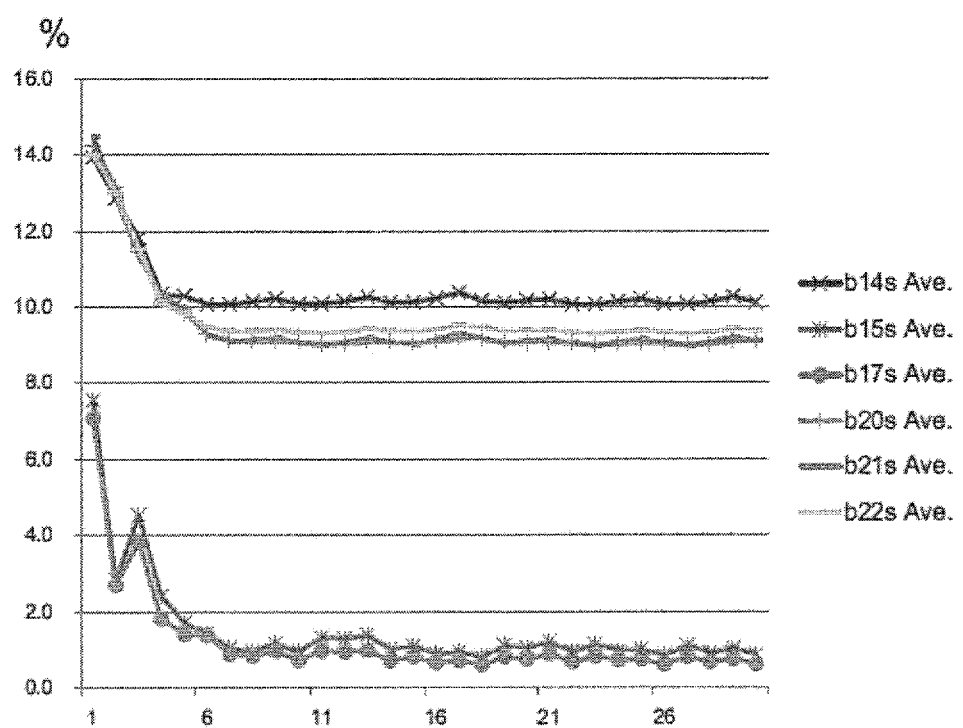
FIG. 14 illustrates an example of graph showing temporal change of average capture power after N dummy cycles.

Further, referring to Table 8, Table 9, FIG. 14, Table 10 and Table 11, the comparison result between the method of Example 3 and the conventional method is described. Table 8 shows toggle rates. Table 9 shows peak values of toggle rates obtained by each method. FIG. 14 illustrates an example of graph showing temporal change of average capture power after N dummy cycles. The horizontal axis indicates the number of dummy cycles. The vertical axis indicates the value of Weighted Transition Metric. Table 10 shows an example of peak values of capture power when captured only once after 30 dummy cycles. Table 11 shows an example of fault coverages when intermediate extraction is repeated 10 times while dummy cycle is repeated 10 times. Here, "b14s," "b15s," "b17s," "b20s," "b21s," and "b22s" are the names of circuits. "PLPF" is the method of Example 3. "ALP" and "LT" are conventional methods as targets for comparison. "LFSR" shows the case where the values of bits are not changed from those outputted from LFSR. The numbers in parentheses show the number of reference bits.

Table 8 shows toggle rates. PLPF(5) indicates toggle rates close to those of corresponding conventional methods, LT(4) and ALP(3). These results mean that PLPF(5) has shift power reduction effect close to conventional methods.

Table 9 shows peak values of toggle rates. Shift power is proportional to peak value. And the larger shift power is, the louder noise is. Because troubles such as IR drops depend on the loudness of the noise, reducing peak values is important. PLPF(5) indicates lower peak values of toggle rates than those of corresponding conventional methods, LT(4) and ALP(3). These results mean that PLPF(5) has more noise reduction effect than conventional methods.

Because the average value of shift power reduction is close and the peak values are lower, it can be seen that the variation of toggle rates when using the method of Example 3 is smaller than when using conventional methods, which means the method of Example 3 has high controllability. Because high controllability is favorable for balancing fault coverage and power reduction, the method of Example 3 is useful.

TABLE 8

| Circuit | LFSR | LT(4) | ALP(3) | PLPF(5) |
|---|---|---|---|---|
| b14s | 49.3 | 9.1 | 11.4 | 9.9 |
| b15s | 49.1 | 7.4 | 9.1 | 8.2 |
| b17s | 49.0 | 7.4 | 8.7 | 8.2 |
| b20s | 49.5 | 8.6 | 9.6 | 9.8 |
| b21s | 49.5 | 8.8 | 9.5 | 9.8 |
| b22s | 49.5 | 9.2 | 10.1 | 10.2 |
| Ave. | 49.3 | 8.4 | 9.7 | 9.4 |

TABLE 9

| Circuit | LFSR | LT(4) | ALP(3) | PLPF(5) |
|---|---|---|---|---|
| b14s | 65.5 | 25.8 | 24.3 | 23.1 |
| b15s | 62.6 | 18.6 | 18.2 | 15.6 |
| b17s | 58.6 | 16.2 | 15.7 | 13.3 |
| b20s | 63.9 | 21.0 | 21.9 | 19.0 |
| b21s | 63.2 | 21.0 | 21.9 | 18.9 |
| b22s | 62.7 | 22.1 | 19.9 | 17.6 |
| Ave. | 62.7 | 20.8 | 20.3 | 17.9 |

Further, capture power reduction effect when dummy cycle method is also utilized is described. Dummy cycles are the cycles where, during capture cycles, output pattern outputted from the circuit under test is inputted into the circuit again as an input test pattern without capturing. As shown in FIG. 14, it is known that an input test pattern with small number of transitions can be obtained by repeating dummy cycles several times. By adopting dummy cycle method with the test pattern generation method in accordance with the present invention, power consumption during capturing and noise are reduced and delay faults can be accurately detected.

As shown in Table 10, PLPF(5) can reduce the peak values of capture power than those of corresponding conventional methods, LT(4) and ALP(3). Besides, adopting dummy cycle method and intermediate extraction method in combination, remarkable effect is obtained. As shown in Table 11, fault coverage is higher than that of corresponding conventional methods by as much as 16% or more and higher than that of LFSR by as much as about 5% in average. This is noticeable result that the fault coverage becomes higher than that of LFSR, considering that the number of test pattern can be usually several times as many for increasing fault coverage by several percentages.

In summary, the method of Example 3 is, compared to conventional methods, favorable in higher controllability, less shift power, less capture power and higher fault coverage by as much as 16% or more.

TABLE 10

| Circuit | LFSR | LT(4) | ALP(3) | PLPF(5) |
|---|---|---|---|---|
| b14s | 41.2 | 48.6 | 43.7 | 27.8 |
| b15s | 19.6 | 25.4 | 16.9 | 11.6 |
| b17s | 13.9 | 17.0 | 16.2 | 6.9 |
| b20s | 37.3 | 41.0 | 43.5 | 25.3 |
| b21s | 37.6 | 42.2 | 42.7 | 29.6 |
| b22s | 30.9 | 35.4 | 28.6 | 22.9 |
| Ave. | 30.1 | 34.1 | 31.9 | 20.7 |

TABLE 11

| Circuit | LFSR | LT(4) | ALP(3) | PLPF(5) |
|---|---|---|---|---|
| b14s | 85.0 | 79.0 | 81.2 | 89.3 |
| b15s | 75.2 | 40.8 | 52.2 | 92.9 |

TABLE 11-continued

| Circuit | LFSR | LT(4) | ALP(3) | PLPF(5) |
|---|---|---|---|---|
| b17s | 84.3 | 83.9 | 81.1 | 91.7 |
| b20s | 80.5 | 56.4 | 49.6 | 67.6 |
| b21s | 86.0 | 84.9 | 82.8 | 92.4 |
| b22s | 85.3 | 83.2 | 81.4 | 91.4 |
| Ave. | 82.7 | 71.4 | 71.4 | 87.6 |

As shown above, by utilizing the test pattern generation device in accordance with the present invention, it is possible to generate a test pattern with spatially and/or temporally controlled fault coverage and toggle rate according to purposes.

Here, combinational circuits in the combinational circuit portion may be a logic circuit without AND gate as long as logic circuit portion equivalent with the logical products is included. And as shown in level 0 above, a logic circuit may be the logic circuit of equivalence.

In addition, the weight $a_{-1}$, $a$, $a_1$ and the like may be different values from each other for specific purpose.

Figure 15:
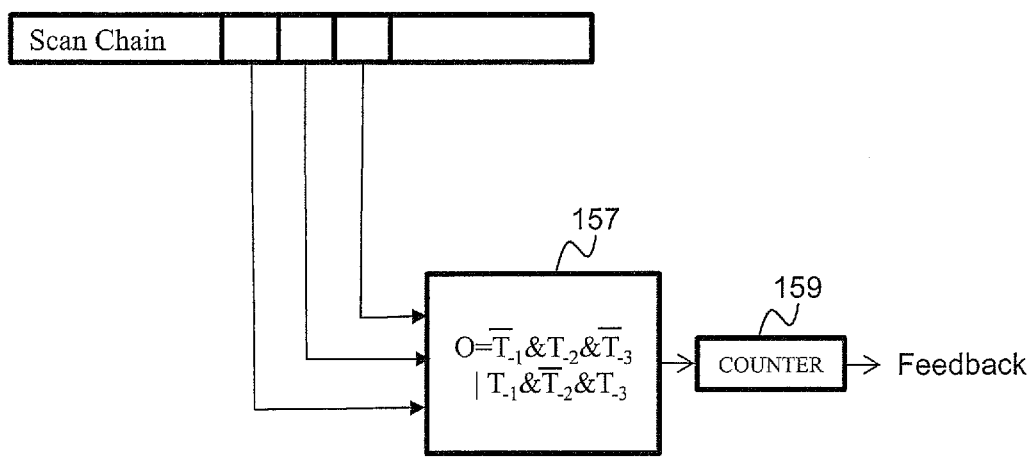
FIG. 15 illustrates an example of feedback circuit for feeding back reverse number of logic values in a generated test pattern.
Figure 16:
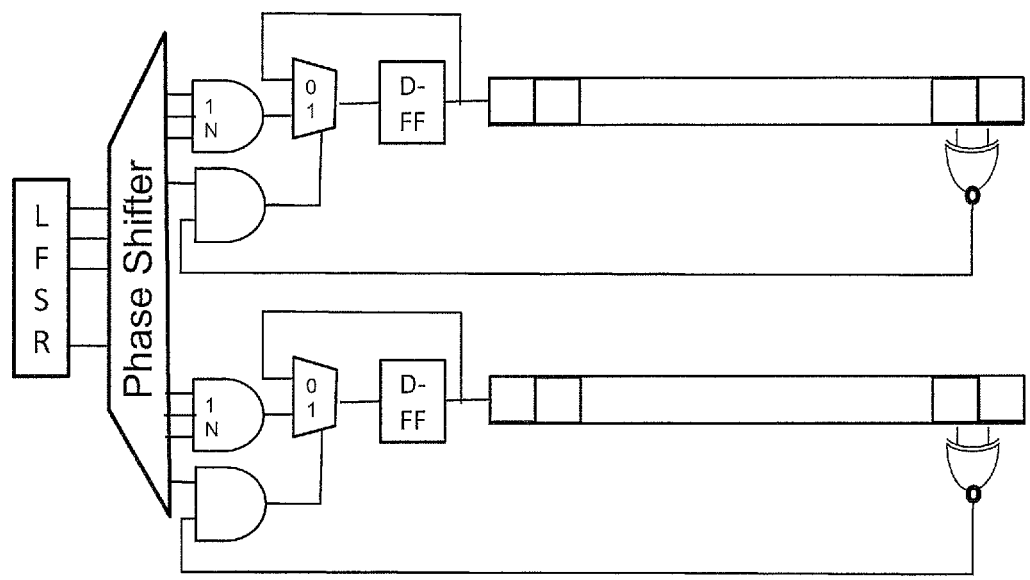
FIG. 16 illustrates a logic circuit diagram of a conventional test pattern generation device.

Further, the switch unit 153 may switch circuits based on feedback information from the feedback portion 161. FIG. 15 illustrates an example of feedback circuit for feeding back reverse number of logic values in a generated test pattern.

Referring to FIG. 15, the logic values of bits extracted from a generated test pattern by the extraction unit 155 are inputted into the condition judgment unit 157. The condition judgment unit 157 judges if the reverse number of the logic values extracted by the extraction unit 157 reaches a predetermined number along with some spatial adjacency and/or temporal continuity. The toggle rate before scan-in can be controlled but the toggle rate of values scan-outted from the circuit under test cannot be controlled. Thus, the condition judgment unit 157 has to judge.

For example, in FIG. 15, as a condition to detect a high frequency component, O=(not $T_{-1}$) & $T_{-2}$ & (not $T_{-3}$)+$T_{-1}$ & (not $T_{-2}$) & $T_{-3}$ is set. Here, (not $T_{-1}$) denotes the reverse of $T_{-1}$. That is, the condition judgment unit 157 judges if the condition that "the reverse number of logic values of extracted bits is two ore more" like 101 or 010 is met or not. If the condition is met, the number of the counter 159 is incremented. If the count number of the counter 159 becomes more than a predetermined number, the feedback unit 161 feeds information back to the switch unit 153.

Here, the circuit corresponding to the condition judgment unit 157 may be different from that shown in FIG. 15. For example, the extraction unit 155 may extract bits one by one and the number of the counter 159 may be incremented every time the logic value of the extracted bit is reversed. In addition, the condition judgment unit may judge all the scan chains or may judge only a part of them.

Further, the fault detection system including the test pattern generation device in accordance with the present invention may include a first extraction unit (an example of "first extraction unit" in Claims) which intermediately extracts, a first extraction control unit (an example of "first extraction control unit" in Claims) for controlling the first extraction unit, a dummy cycle assignment unit (an example of "dummy cycle assignment unit" in Claims) for assigning the number of dummy cycles, a second extraction unit for extracting logic values which are scan-outted after the capture cycle finishes, a comparison unit (an example of "comparison unit" in Claims) for comparing an output logic value extracted by the second extraction unit and an output logic value estimated to be outputted if there is no fault in the circuit under test or an output logic value estimated to be outputted if there is a specific fault in the circuit under test, and a fault judgment unit (an example of "fault judgment unit" in Claims) which judges if there is a fault or not in the circuit under test based on comparison result by the comparison unit

REFERENCE SIGNS LIST

101 & 301: Test pattern generation device;
21, 22, 23, 24: Reference bit;
22: target bit
103: selection unit
4: bit which has a newly generated logic value
5 % 105: logic value generation unit
107: memory unit
9 & 109: storing unit
139: appointed time test vector selection unit
147: combinational circuit portion
149: judgment unit
151: combinational circuit
153: switch unit
155: extraction unit
157: condition judgment unit
159: counter
161: feedback unit

The invention claimed is:

1. A test pattern generation device for generating a test pattern to be inputted into a circuit under test of scan test, comprising:
   a logic value generation unit for generating a new logic value by referring given logic values of a first bit, a second bit and a third bit and by keeping or reversing a logic value of the second bit; and
   a storing unit for storing a logic value generated by the logic value generation unit,
   wherein a logic value of the first bit is the same with a logic value of an initial test pattern which is a given test pattern or with a logic value of a new test pattern generated by the test pattern generation device based on the initial test pattern,
   wherein a logic value of the second bit is the same with a logic value of the initial test pattern,
   wherein a logic value of the third bit is the same with a logic value of the initial test pattern or with a logic value of the new test pattern,
   wherein a logic value of the first bit is, in advance, generated by the logic value generation unit and stored in the storing unit, and
   wherein the logic value generation unit generates a logic value of a bit included in a newly generated test pattern by keeping or reversing a logic value of the second bit, based on logic values of the first bit stored in the storing unit, the second bit and the third bit.

2. The test pattern generation device of claim 1, wherein the first bit, the second bit and the third bit are bits to be input into pluralities of spatially adjacent scan chains or bits to be input into the circuit under test temporally continuously via a single scan chain, and wherein the storing unit is a scan flip-flop.

3. The test pattern generation device of claim 1, wherein the logic value generation unit includes:
   pluralities of different combinational circuits that output logic values; and
   a switch unit that switches the pluralities of different combinational circuits, wherein, into one of the pluralities of different combinational circuits, logic values of 0 or 1 of the first bit, the second bit and the third bit are input.

4. The test pattern generation device of claim 3, further comprising:
an extraction unit that extracts a part of or all of logic values including those of the first bit, the second bit and the third bit from logic values of the initial test pattern and/or a test pattern generated by the test pattern generation device;
a condition judgment unit that judges if number of reverse of logic values extracted by the extraction unit along spatial adjacency and/or temporal continuity reaches a predetermined number or not; and
a feedback unit that feeds a judgment result by the condition judgment unit back to the switch unit.

5. A fault detection system that detects a fault based on output from a circuit under test, comprising:
an initial input test pattern storing unit that stores a test pattern generated by a test pattern generation device as an initial input test pattern, the test pattern generation device comprising:
a logic value generation unit for generating a new logic value by referring given logic values of a first bit, a second bit and a third bit and by keeping or reversing a logic value of the second bit,
wherein a logic value of the first bit is the same with a logic value of an initial test pattern which is a given test pattern or with a logic value of a new test pattern generated by the test pattern generation device based on the initial test pattern,
wherein a logic value of the second bit is the same with a logic value of the initial test pattern, and
wherein a logic value of the third bit is the same with a logic value of the initial test pattern or with a logic value of the new test pattern;
a first extraction unit that extracts a part of or all of pluralities of output logic values outputted from the circuit under test into which the initial input test pattern is inputted in advance;
a comparison unit that compares an output logic value extracted by the first extraction unit, and an output logic value estimated to be outputted if there is no fault in the circuit under test or an output logic value estimated to be outputted if there is a specific fault in the circuit under test; and
a fault judgment unit that judges if there is a fault or not in the circuit under test based on comparison result by the comparison unit;
wherein the pluralities of output logic values are inputted into the circuit under test as a new input test pattern,
wherein each of the pluralities of logic values are stored in a storing unit which stores logic values into pluralities of individual storing units which stores a single logic value,
wherein the first extraction unit extracts a part of or all of the pluralities of output logic values stored in the storing unit, and
wherein the first extraction unit extracts a part of or all of the output logic values stored in the pluralities of individual storing units directly without passing through another individual storing unit.

6. The fault detection system of claim 5, further comprising:
a first extraction control unit that controls the first extraction unit; and
a dummy cycle assignment unit that assigns number of dummy cycle,
wherein the first extraction control unit controls the first extraction unit not to extract the pluralities of output logic values during capture cycles which the dummy cycle assignment unit assigns as dummy cycles.

7. A test pattern generation method using a test pattern generation device for generating a test pattern to be inputted into a circuit under test of scan test, comprising:
a logic value generation step for generating a new logic value by keeping or reversing a logic value of a second bit included in an initial test pattern, which is a given test pattern, and/or a test pattern generated by the test pattern generation device based on the initial test pattern, referring to a first bit, the second bit, and a third bit included in the initial test pattern and/or the test pattern generated by the test pattern generation device; and
a storing step for storing a logic value generated in the logic value generation step,
wherein a logic value of the first bit is the same with a logic value of an initial test pattern which is a given test pattern or with a logic value of a new test pattern generated by the test pattern generation device based on the initial test pattern,
wherein a logic value of the second bit is the same with a logic value of the initial test pattern,
wherein a logic value of the third bit is the same with a logic value of the initial test pattern or with a logic value of the new test pattern,
wherein a logic value of the first bit is, in advance, generated by the logic value generation unit and stored in the storing unit, and
wherein the logic value generation unit generates a logic value of a bit included in a newly generated test pattern by keeping or reversing a logic value of the second bit, based on logic values of the first bit stored in the storing unit, the second bit and the third bit.

8. A program capable of causing a computer to execute the method of claim 7.

9. A non-transitory computer-readable medium storing a computer program of claim 8.

* * * * *